United States Patent [19]

Callahan

[11] 4,424,625

[45] Jan. 10, 1984

[54] CONNECTOR REMOVAL TOOL

[75] Inventor: Daniel L. Callahan, Roseville, Minn.

[73] Assignee: Sperry Corporation, New York, N.Y.

[21] Appl. No.: 336,758

[22] Filed: Jan. 4, 1982

[51] Int. Cl.³ .......................... H05K 3/32; H05K 13/04

[52] U.S. Cl. .......................................... 29/764; 29/275

[58] Field of Search ................. 29/764, 762, 275, 270, 29/278, 426.6

[56] References Cited

U.S. PATENT DOCUMENTS

| | | | |
|---|---|---|---|
| 3,619,887 | 11/1971 | McLaughlin | 29/275 X |
| 3,846,895 | 11/1974 | Cosham et al. | 29/764 |
| 4,207,665 | 6/1980 | Kurek | 29/764 X |

*Primary Examiner*—Carl E. Hall

*Attorney, Agent, or Firm*—Charles A. Johnson; Kenneth T. Grace; Marshall M. Truex

[57] ABSTRACT

A removal tool for removing strip electrical connectors held in place by friction contact with electrical interconnection ends associated therewith is described. A pair of spaced apart wall members have inclined plane members associated therewith for engaging the undersurface of the connector to be removed for forcing the connector away from the support surface for sequentially disengaging the electrical interconnecting pins as the removal tool is moved axially along the longitudinal length of the connector.

7 Claims, 5 Drawing Figures

CONNECTOR REMOVAL TOOL

BACKGROUND OF THE INVENTION

1. Field of the Invention

This invention relates to the tools for disengagement and removal of electrical connectors held in place on a support member and having electrical interconnection pins in friction engagement therein.

2. State of the Prior Art

Zero Insertion Force (ZIF) connector assemblies are utilized in the electronics industry for making edge connections to printed circuit boards. Characteristically, these ZIF connectors utilize a large member of electrical contacts which extend through a mounting panel and have contact in the ZIF connector assembly making friction contact therewith. The portion of the pins that extend through the support assembly are available for making wire interconnections. The portions of the pins within the ZIF connector assembly make contact with printed circuit lines on the printed circuit board associated therewith. When the ZIF connector is installed, all of the pins are mounted in the support assembly and the connector is placed in alignment over the pin ends and forced into an installed position. When installed, the ZIF connector has a surface of the ZIF connector in contact with the support member. All of the electrical contact pins are aligned in respectively associated apertures in the connector, and in a position for making electrical contact with the printed circuit board when installed. It is common that there be a relatively large number of pins associated with each ZIF connected, ranging for example from a dozen or more up to in excess to 250 contacts. It is essential that the ZIF connector be installed on all of the pins simultaneously so that the pins remain aligned in the properly associated apertures in the connector.

To remove an electrical connector, it is common to attempt to disengage a few pins at a time by prying a portion of the connector away from the support member. There is sufficient flexibility in the normal connector to allow the sequential disengagement of pins during the removal process. A common approach is to utilized a screw driver to simply pry upwardly on the connector at various points on the support assembly. This has the obvious disadvantage of not being a controlled tool and often causes damage to the connector as well as damage to the support member. If extreme care is not taken, the screw driver also tends to damage pins that may be encountered during the prying operation.

One ZIF connector manufacturer has provided a removal tool that is simply a pair of gripping fingers associated with a handle and a pair of supporting legs. The gripping fingers are forced under the ends of the connector to be removed and pried in a direction away from the support member. This system has the problem that the supporting legs tend to cause damage to the support member during the prying process, and the gripping fingers have been determined to damage the connector being removed. Further if care is engaging the gripping fingers is not exercised, there is a tendency to damage the pins.

SUMMARY OF THE INVENTION

The invention is a connector removal tool for use in removing strip electrical connectors having friction contact with electrical interconnection pins associated therewith and mounted to a support assembly. A pair of spaced apart wall members, having a spacing sufficient to accommodate the width of the electrical connector to be removed, are maintained in a spaced apart relationship by a joining member. A handle or striking bar is affixed to the joining member for allowing motive force to be applied to the tool. Each of the wall members has a connector deflecting apparatus associated therewith, the arrangement being such that as the removal tool is moved along the length of a connector to be removed, the deflecting members engage the underside of the connector and force a separating movement from the support assembly. The spacing of the deflection members is such that the electrical contact pins are not engaged by the removal tool.

OBJECTS

It is a primary object of this invention to provide an improved tool for the removal of strip electrical connectors having electrical interconnection pins in friction contact with portions thereof.

Another object is to provide an improved connector removal tool that will not damage a support assembly when used in the removal process.

Still a further object is to provide an improved removal tool that will not damage the electrical interconnection pins during removal of the connector.

Yet a further object is to provide an improved connector removal tool that utilizes inclined plane deflection members for separating the electrical connector from the surface of the support assembly for disengaging friction contact electrical interconnection pins from the connector being removed in a serial fashion.

A further object is to provide an improved tool for removing strip electrical connectors that can be adjusted for different width strip connectors.

Still another object is to provide an improved connector removal tool that can remove strip connectors assembled in a closely spaced apart relationship on a support assembly.

These and other more detailed and specific objectives of the invention will be more thoroughly understood from consideration of the drawings and the description of the preferred embodiment.

DESCRIPTION OF THE PREFERRED EMBODIMENT

Figure 1:
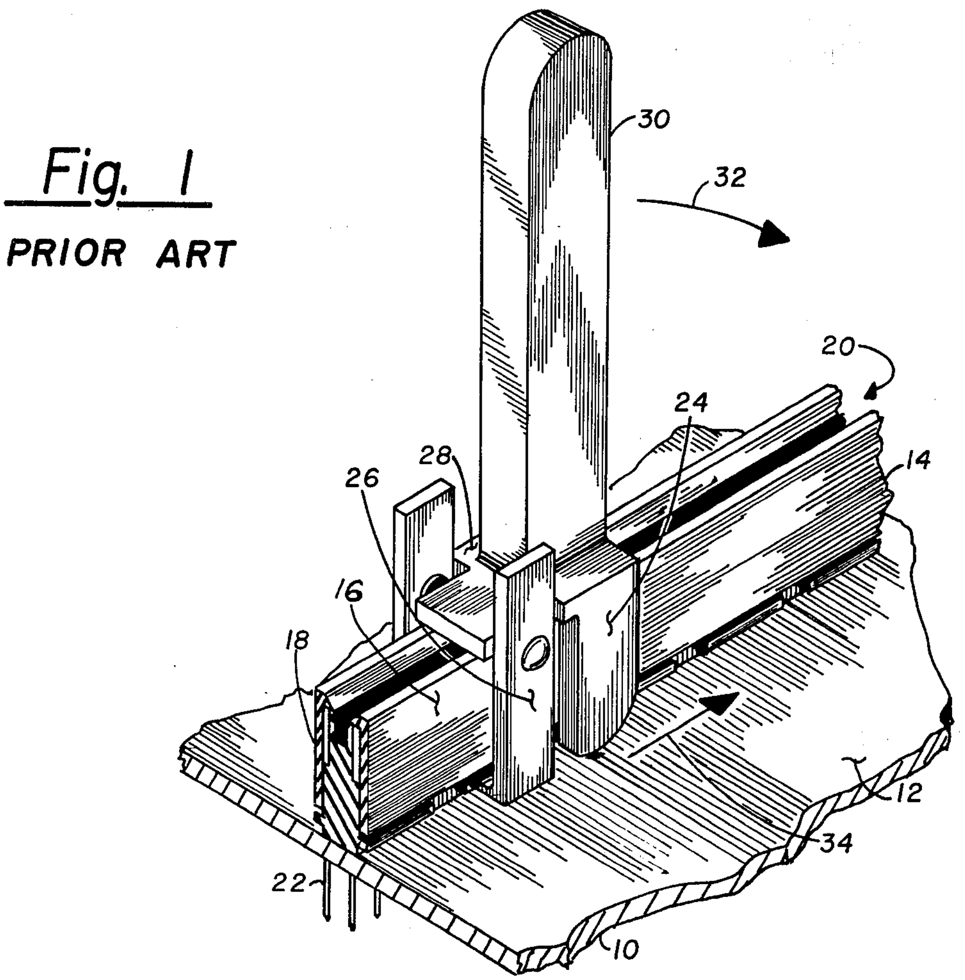
Fig. 1 PRIOR ART
FIG. 1 is a perspective view of a Zero Insertion Force connector assembly mounted on a mounting panel, and illustrating a type of prior art connector removal tool.

FIG. 1 is a perspective view of a Zero Insertion Force (ZIF) connector assembly mounted on a mounting panel, and illustrating a type of prior art connector removal tool. A support member 10 has a surface 12 upon which a connector 14 is supported. The support member 10 is characteristically a multilayer printed circuit board and is shown broken away, it being understood that the support member is normally adapted to support a plurality of connector elements 14. The connector assembly 14 can be characteristically a Zero Insertion Force connector of a type available from commercial sources, and in particular AMP, Inc., and for example part number 2-118201-6 for a connector having 140 dual positions. ZIF connectors of this type have a pair of wall members 16 and 18 which have a channel identified by arrow 20 therebetween. The channel is adapted for receiving the edge of a printed circuit board for making edge connections with connector terminals in connector 14. When wall member 16 and 18 are rotated outwardly, channel 20 is enlarged for allowing easy insertion of the printed circuit board (not shown). When the ZIF connector is closed and locked, wall members 16 and 18 previously restraining the pins, release the pins, and allow them to make electrical interconnection with the edge connector portions thereon. Edge connectors of this type are known and need not be described in detail further to understand the present invention. A plurality of connection pins 22 extend through the support member 10 and into the connector 14. The contact end of the pins 22 that reside in the connector 14 are in friction contact therewith. For the embodiment shown, there would be 280 pins 22 in contact with the connector 14, thereby exerting a large holding force for tending to hold the connector 14 in contact with the surface 12 of support member 10. It is well-known that connector arrangements of this type are difficult to remove due to this holding force of the pins. The prior art removal arrangement has utilized various arrangements in attempting to aid in the removal process.

One type of prior art system for removing ZIF connectors has been to insert a screw driver blade between the surface 12 and the under surface of connector 14. With a prying motion, the screw driver is then worked along the axial length of the connector thereby attempting to disengage some of the pins. As noted, this type of disengagement is not controlled and results in damage to the connector 14, damage to the pins 22, and often times damage to the surface 12 of the support member 10. Another type of prior art device involves a more controlled prying mechanism having legs 24 straddling the connector 14 and for engaging the surface 12. A pair of gripper fingers, one of which is visible and labeled 26 are hingedly mounted to a joining member 28. These gripping fingers 26 are on each side of the connector 14 and are equipped with transverse protrusions that are capable of being inserted under the edge of connector 14. Normally it is necessary to force the protrusions under connector 14 and to hold them in place during the prying operation. As the handle 30 is moved in the direction of arrow 32, the legs 24 act as a fulcrum and the gripping fingers 26 tend to raise the connector 14 from the surface. When the connector has been somewhat displaced, the entire assembly is moved in the direction of arrow 34 and the prying action again is repeated. This tool has the distinct disadvantage that the gripping fingers tend to slip from contact with the connector 14 and cause damage to the connector. This damage can be breaking of the connector or chipping the surface. Chips left on the support member get in the pin area, and can cause electrical failure of the pin interconnection with PC board if undetected and not cleaned off. Further, due to the relatively loose structure, there is a tendency to damage the electrical contacts as they are exposed when the connector is lifted. Due to the pressure applied by legs 24, there is a tendency to damage surface 12 of the support member 10.

While only one broken away connector section 14 is shown, it should be understood that in common usage, there would be a plurality of connectors of this type relatively closely spaced along the surface 12, each adapted for making connections with associated edge connection printed circuit cards. This close spacing also creates a problem for insertion and use of prior art prying devices.

Figure 2:
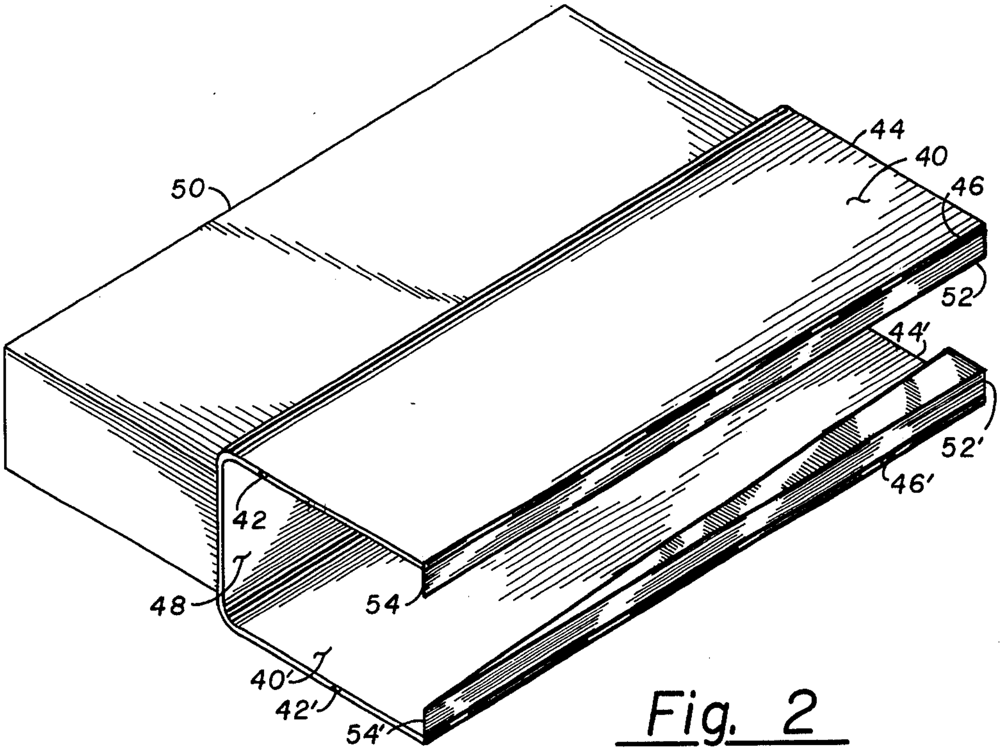
FIG. 2 is a perspective view of a connector removal tool for use in removing strip electrical connectors having friction contact with electrical interconnection pins associated therewith and mounted to a support assembly.

FIG. 2 is a perspective view of a connector removal tool for use in removing strip electrical connectors having friction contact with electrical interconnection pins associated therewith and mounted to a support assembly. The improved removal tool has a pair of spaced apart wall members 40 and 40'. The wall members have leading edges 42 and 42', trailing edges 44 and 44', the bottom edges 46 and 46', respectively. A joining member 48 connects the upper extremeties of wall members 40 and 40', and holds them in a parallel spaced apart relationship forming a channel therebetween.

A striking member 50 is mounted to joining member 48, and is utilized as a hand holding for applying motive force to the removal tool. The structure is such that the striking bar 50 can be tapped with a hammer or other means for applying additional force to cause the removal tool to move along the surface of the support member. A pair of inclined plane members 52 and 52' are mounted adjacent bottom edges 46 and 46' of wall members 40 and 40', respectively, and define a slot therebetween. The inclined plane members 52 and 52' have leading edges 54 and 54', respectively, that are substantially sharp and adapted for easy insertion between the lower surface of connector 14 and the supporting surface 12 of the support member 10. Dimensions will be described in more detail below, but it should be understood that the inclined plane has a dimension such that as the removal tool is moved along, there is sufficient deflection of the connector 14 to cause it to be disengaged from the pins 22 in a serial fashion as the tool is moved axially along the length of the connector.

Figure 3:
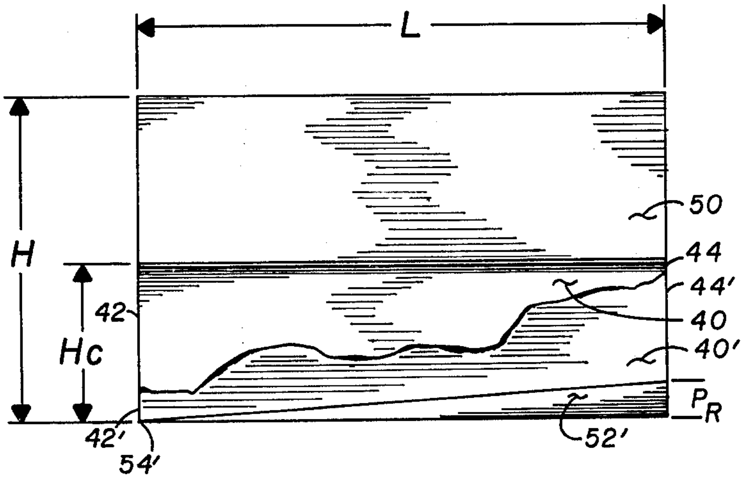
FIG. 3 is a side elevation view of the connector removal tool having a portion shown cut away to expose the inclined plane deflecting member.

FIG. 3 is a side elevation view of the connector removal tool having a portion shown cut away to expose the inclined plane deflecting member. A portion of wall 40 is broken away to expose inclined plane 52' which is affixed to wall 40', for example by welding. The overall Length L is nominally three inches. The rise of the inclined plane is the Pin Rise $P_R$ and is nominally 0.15 inch for this embodiment. The overall Height H is nominally 1.98 inches and the height of the opening between the wall members 40 and 40' $H_C$ is nominally 0.98 inch. The height $H_C$ must be sufficient to accommodate the height of the connector 14 with which the removal tool will be used, plus the height of the deflection $P_R$ to disengage the pins.

Figure 4:
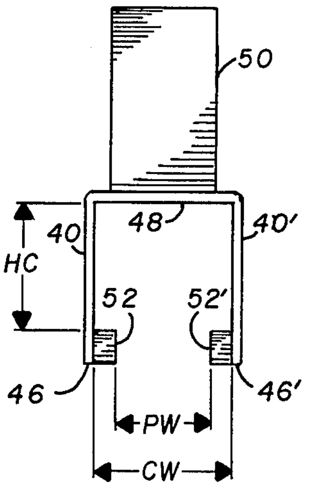
FIG. 4 is an end elevation view of the connector removal tool illustrating a dimension and spacing relationship.

FIG. 4 is an end elevation of the connector removal tool illustrating a dimension and spacing relationship. The spacing between wall members 40 and 40' is selected to be the Connector Width $C_W$ for which the removal tool will be utilized. For the embodiment described, this width is nominally 0.48 inch. The slot spacing between inclined plane members 52 and 52' is selected to clear the pins 22 associated with the connector and is identified as Pin Width $P_W$. For this embodiment, each of the inclined plane members 52 and 52' are 0.12 inch in width, whereby $P_W$ is nominally 0.24 inch. The wall members 40 and 40' are constructed from sheet steel having a thickness of 0.030 inch. The formation of wall members 40 and 40' to the joining member 48 can be accomplished by welding, or can be formed from a unitary sheet of stock material bent in the channel shape illustrated. The striking member 50 is connected as by welding to the joining member 48. With the materials and the configuration described, the removal tool is durable and can withstand the pressures necessary for repeated usage in removal of ZIF connectors of the type described. It should be understood and is contemplated that the removal tool could be molded from plastic or like material as a unitary construction and would function within the scope and intent of this invention.

Figure 5:
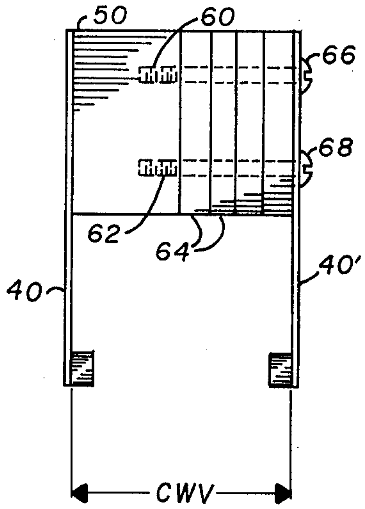
FIG. 5 is an end elevation view of a connector removal tool capable of adjustable width selection for accommodating different width connectors.

FIG. 5 is an end elevation view of a connector removal tool capable of adjustable width selection for accommodating different width connectors. This is an alternate embodiment of the invention that provides for adjustability of the channel Connector Width which can be a Variable $C_{WV}$ to accommodate varying widths of connectors. To accommodate this adjustability, the striking member 50 is provided with tapped threaded holes 60 and 62. A plurality of spacer plates 64 are available for adjusting the spacing between the surface of striking member 50 and wall member 40'. The spacer 64 can be held in place by screws 66 and 68 which engage tapped holes 60 and 62 respectively. Adjustable height can be provided by slots in the wall members (not shown). It is of course obvious that other methods of mounting and holding the adjustment spacers can be used. Further more complex screw adjustment or the like could be used for allowing width adjustment.

Having described the purposes and objectives of the invention, together with a description of the preferred embodiments of the invention, and operation thereof, what is intended to be protected by letters patent is set forth in the dependent claims.

What is claimed is:

1. For use in removing a strip electrical connector held in place by friction contact with electrical interconnection pins associated therewith and mounted to a support assembly, a removal tool comprising:
   - a pair of wall member means arranged in a spaced apart relationship forming a channel therebetween to accommodate the width of an electrical connector to be removed, each of said wall members having leading, trailing, top and bottom edges;
   - joining means coupled intermediate said pair of wall member means for holding said pair of wall member means in said spaced apart relationship;
   - striking means coupled to said joining means for allowing motive force to be applied to the removal tool; and
   - deflection means mounted at each of said bottom edges forming smooth surfaces with said bottom edges for sliding on a support assembly and disposed along the length thereof for defining a continuous slot therebetween, said deflection means for deflecting the electrical connector out of holding contact with the friction fit electrical pins without contacting said electrical pins as the removal tool is moved axially along the length of the connector being removed, said deflection means of a predetermined length sufficient to avoid damage to said electrical connector or said electrical pins during removal.

2. A removal tool as in claim 1 wherein said deflection means include a pair of inclined plane members, each associated with and mounted to a different one of said pair of wall member means, and each extending from said leading edge to said trailing edge and having a height at said trailing edge sufficient to raise the electrical connector for disengaging said electrical pins.

3. A removal tool as in claim 2 wherein said joining means, includes width adjusting means for adjusting the spacing between said pair of wall members for accommodating different width connectors.

4. A removal tool as in claim 2 wherein said pair of wall member means and said joining means are unitarily formed from sheet material.

5. For use in removing a strip electrical connector held in place by friction contact with electrical interconnection pins associated therewith and mounted to a support assembly, a removal tool comprising:
   - a pair of spaced apart wall members forming a channel therebetween, each of said pair of spaced apart wall members having leading, trailing, top and bottom edges;
   - a joining member associated with and coupled to said top edges of said pair of spaced apart wall members for holding said pair of spaced apart wall members fixedly in said spaced apart relationship for accommodating the width of a strip electrical connector to be removed;
   - striking bar means mounted to said joining member for use as a hand hold and for applying pressure to activate the removal tool; and
   - a pair of inclined plane members, each associated with and mounted to a different one of said pair of spaced apart wall members near said bottom edge thereof and forming a smooth sliding surface therewith, and defining a continuous slot therebetween, and having a sharp leading edge surface in proximity to said leading edge of the associated one of said pair of spaced apart wall members, and each of said inclined plane members having a predetermined width dimension sufficient to engage a predetermined portion of the undersurface of the strip electrical connector to be removed when supported on said support assembly without coming in contact with electrical interconnection pins, whereby as the removal tool is moved longitudinally along the length of the strip electrical connector, the connector is forced upwardly from said support assembly and is disengaged from the holding action of the friction interaction of the electrical interconnection pins.

6. A removal tool as in claim 5 wherein said joining member includes with adjusting means for adjusting the spacing between said pair of spaced apart wall members.

7. A removal tool as in claim 6, wherein said width adjusting means includes a plurality of spacer plates, and holding means for holding selected ones of said spacer plates in position.

* * * * *